(12) United States Patent
Allan et al.

(10) Patent No.: US 7,486,004 B2
(45) Date of Patent: Feb. 3, 2009

(54) PIEZOLELECTRIC DEVICES

(75) Inventors: James Allan, Suffolk (GB); Gareth McKevitt, Cambridge (GB); Mark Richard Shepherd, Hertfordshire (GB); Richard Topliss, Cambridge (GB)

(73) Assignee: 1 ... Limited, Cambridge (GB)

( * ) Notice: Subject to any disclaimer, the term of this patent is extended or adjusted under 35 U.S.C. 154(b) by 224 days.

(21) Appl. No.: 10/493,743

(22) PCT Filed: Oct. 28, 2002

(86) PCT No.: PCT/GB02/04855

§ 371 (c)(1),
(2), (4) Date: May 13, 2005

(87) PCT Pub. No.: WO03/038919

PCT Pub. Date: May 8, 2003

(65) Prior Publication Data

US 2005/0253487 A1  Nov. 17, 2005

(30) Foreign Application Priority Data

Oct. 30, 2001 (GB) ................................ 0126029.8
Feb. 12, 2002 (GB) ................................ 0203267.0

(51) Int. Cl.
*H01L 41/08* (2006.01)
(52) U.S. Cl. ..................................................... 310/328
(58) Field of Classification Search ................ 310/328, 310/330–332, 311, 365–368
See application file for complete search history.

(56) References Cited

U.S. PATENT DOCUMENTS 3,816,774 A * 6/1974 Ohnuki et al. ............... 310/332

(Continued)

FOREIGN PATENT DOCUMENTS

JP  58 066380  7/1983

(Continued)

OTHER PUBLICATIONS

Ervin & Brei, "Parallel and Serial Connection for Piezoceramic Recurve Actuator Arrays", Part of the SPIE Conference on Mathematics and Control in Smart Structures, San Diego, California, Mar. 1998.

(Continued)

*Primary Examiner*—Darren Schuberg
*Assistant Examiner*—Karen B Addison
(74) *Attorney, Agent, or Firm*—Gerry J. Elman; Elman Technology Law, P.C.

(57) ABSTRACT

A piezoelectric device comprising a continuous piezoelectric element (10) extending alternately back and forth to form a plurality of parallel, straight portions (14) arranged in a stack with intermediate linkage portions (15) at alternate ends of the straight portions (14). Each straight portion (14) is constructed and arranged with electrodes (12, 13) to bend, on activation, in the stacking direction in which the straight portions (14) are stacked with opposite curvature in two halves (16, 17) of the straight portion (14) to create displacement between the ends of the straight portion (14) in the stacking direction adding in series through the stack. The continuous nature of the piezoelectric element (10) eases manufacture. Devices with two types of construction are disclosed. Firstly, the continuous piezoelectric element (10) may have a bender construction such as a bimorph bender construction. Secondly, the continuous piezoelectric element (101) may be a sheet of piezoelectric material having overlapping slits (102) extending from alternate sides to form the straight portions (103) between the slits (102), with opposed electrodes (105) arranged on each major surface of the sheet in pairs separated across, and extending along, the straight portions (103).

17 Claims, 8 Drawing Sheets

U.S. PATENT DOCUMENTS 5,410,207 A    4/1995  Miura et al.
6,107,726 A *  8/2000  Near et al. ................ 310/328

FOREIGN PATENT DOCUMENTS

| JP | 1097604 | 4/1989 |
| WO | WO 98 07183 | 2/1998 |
| WO | WO 01/47041 A2 | 6/2001 |

OTHER PUBLICATIONS

Ervin, J.D. et al; "Recurve piezo-electric-strain-amplifying actuator architecture"; IEEE/ASME Transactions on Mechatronics; Dec. 1998; Pages vol. 3, No. 4; pp. 293-301; cited in the application section II, "Recurve actuator architecture" figures 1,2; section V.B.1. "Prototype fabrication" fig 9.

* cited by examiner

FIG. 1
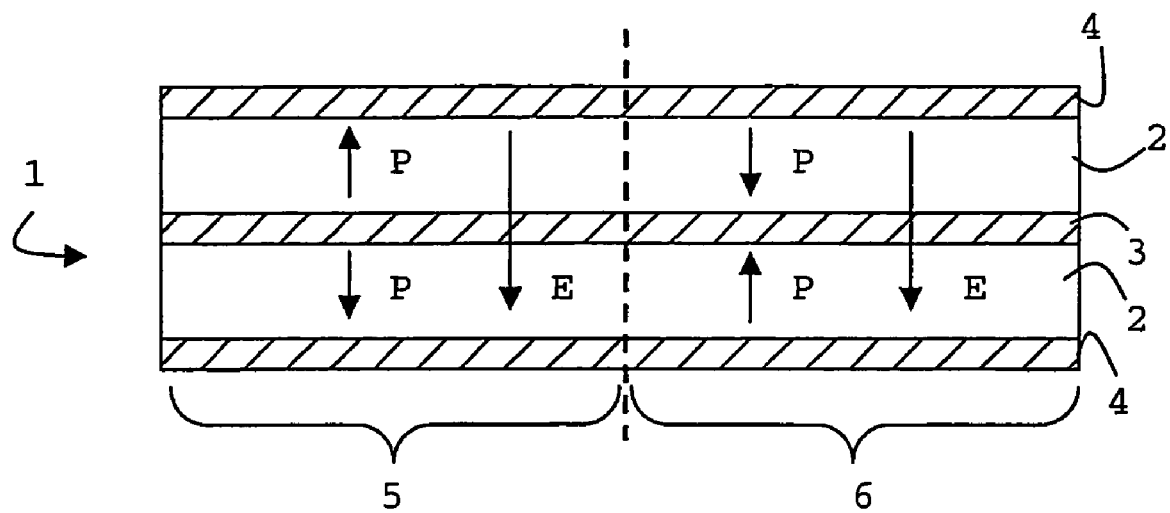
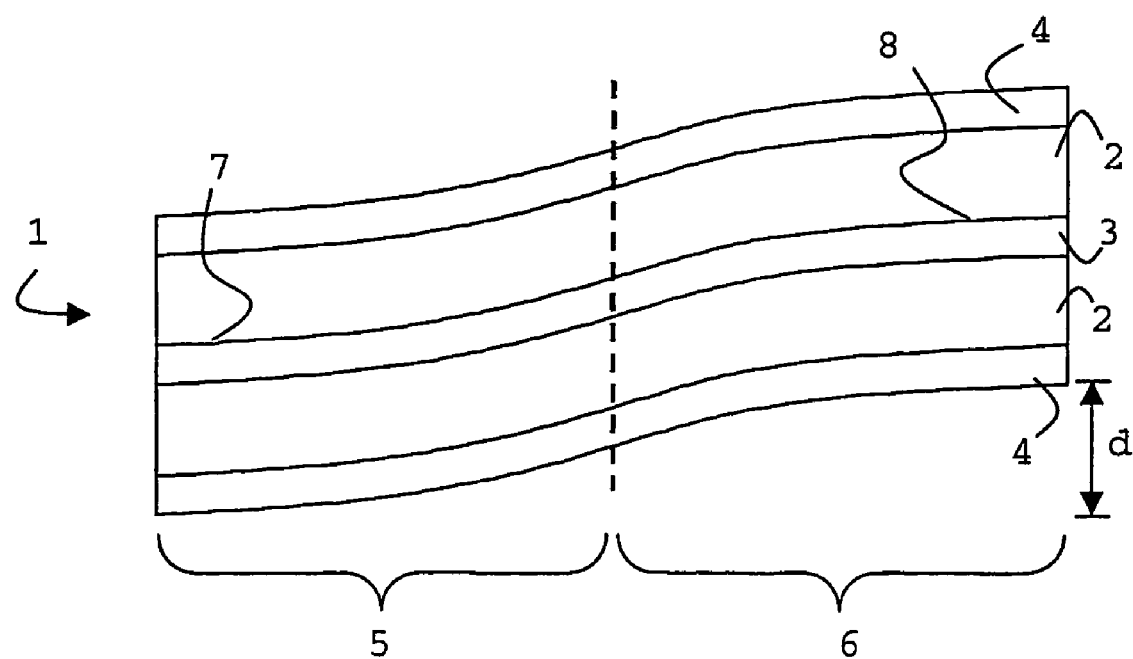
FIG. 2

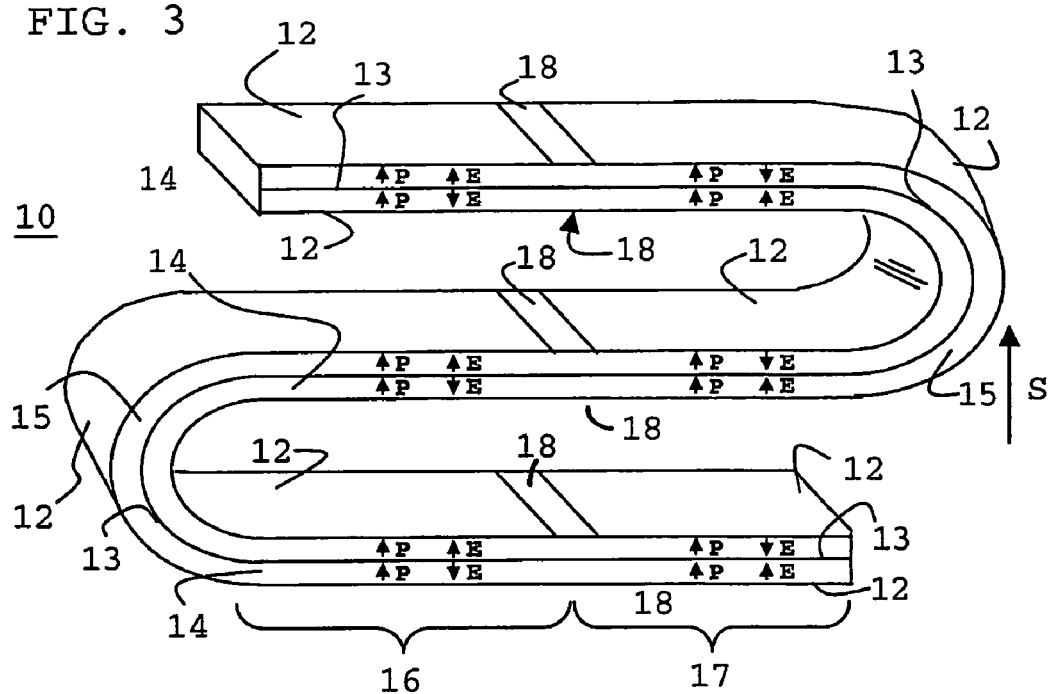
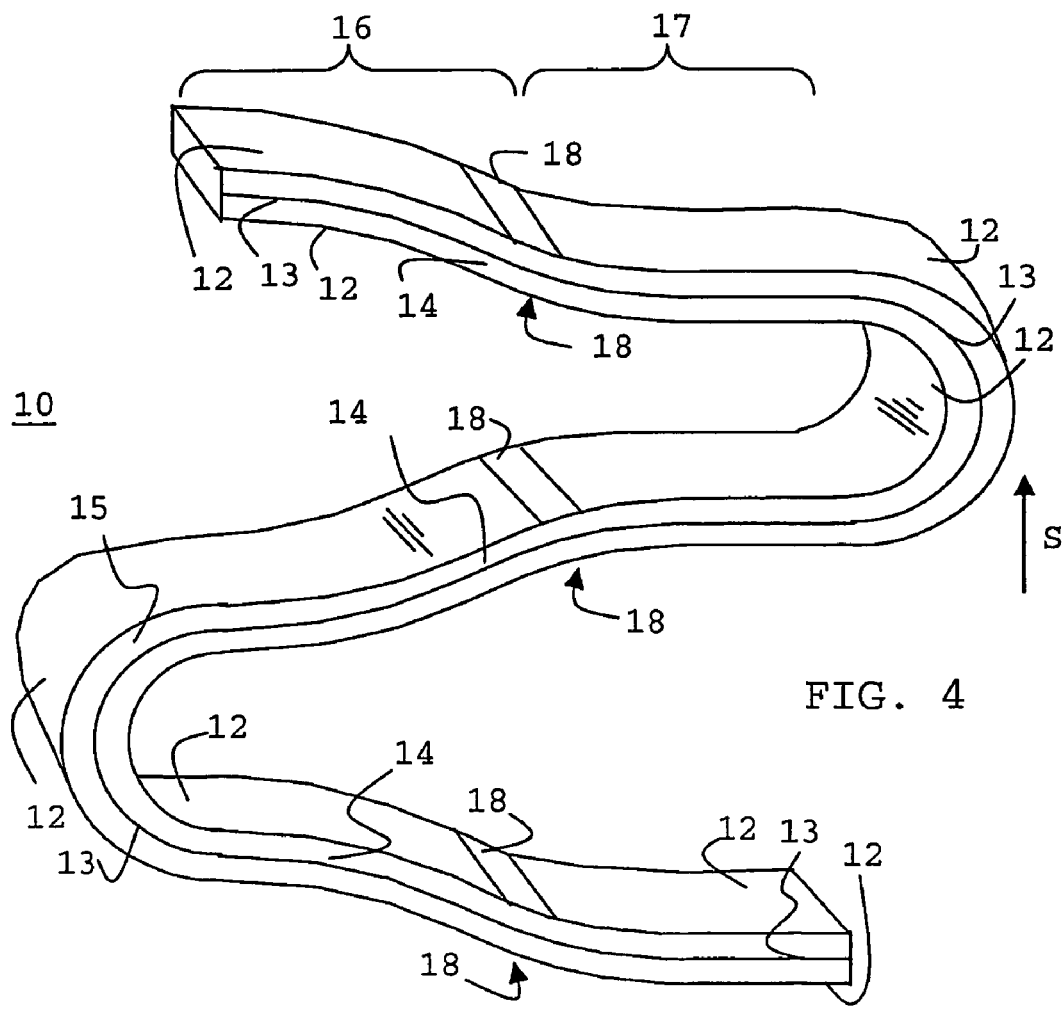

PIEZOLELECTRIC DEVICES

The present invention relates to piezoelectric devices. In particular, the present invention relates to devices where, on activation of the device, a relative displacement occurs. In further aspects, the present invention relates to the method of manufacture of such piezoelectric devices.

Piezoelectric material deforms on electrical activation by an applied electric field, or, vice versa, generates an electrical field in response to applied deformation. There are known many types of piezoelectric device which use piezoelectric material arranged with electrodes to apply or detect the electric field.

The most simple type of piezoelectric device is a block of piezoelectric material activated in an expansion-contraction mode by applying an activation voltage in the direction of poling. However, as the piezoelectric effect is small, of the order of $10^{-10}$ m/V, the change in dimensions is relatively small, less than a micron for a typical device. Therefore piezoelectric devices having a more complicated structure have been developed to achieve larger displacements.

For example a known construction for a piezoelectric device is the bender construction, for example a bimorph bender construction consisting of two layers of piezoelectric material or a multimorph bender construction consisting of more than two layers of piezoelectric material. With a bender construction, the layers are activated in an expansion-contraction mode with a differential change in length between the layers, usually with one layer expanding and another layer contracting. Due to the layers being constrained by being coupled to one another, this differential change in length is concomitant with bending in the thickness direction around an axis across the layers. Accordingly, there is relative displacement of the ends of the device.

FIG. 1 illustrates a piezoelectric device 1 having a bimorph bender construction, FIG. 1 being a cross-sectional view taken along the length of the device 1. The piezoelectric device 1 is of a known type as disclosed in "Recurve Piezoelectric-Strain-Amplifying Actuator Architecture", Ervin & Brei, IEEEE/ASME Transactions on Mechatronics, Vol. 3 No. 4, December 1998. The device 1 comprises two parallel layers 2 of piezoelectric material. Extending parallel to the layers 2 along the entire length of the device 1, there are a centre electrode 3 between the two layers 2 and outer electrodes 4 outside the layers 2. The layers 2 are poled in opposite direction in the two halves 5 and 6 along the length of the element 1, with each layer 2 being poled in opposite directions within each half 5 and 6, as shown by the arrows P.

The device 1 is electrically activated by applying activation voltages of opposite polarity to the outer electrodes 4, whilst holding the centre electrode 3 at ground, to create an electrical field in the same direction across both layers 2 as shown by the arrows E. As a result of the relative directions of poling P and of the electric field E, within each half 5 and 6 the device 1 bends perpendicular to the layers 1, but with an opposite curvature in the two halves 5 and 6. Thus, as illustrated in FIG. 2, this bending causes a relative displacement by an amount d between the ends 7 and 8 of the device 1. Furthermore, as a result of the two halves 5 and 6 being of equal length and the structure of the device 1 being uniform along its length, there is no relative rotation between the ends 7 and 8.

However, for such a known structure, the magnitude of the displacement d is limited by the length of the device 1 which is itself limited by practical considerations. To achieve greater displacements, the article by Ervin & Brei cited above further discloses arrays of separate devices 1 of the type illustrated in FIG. 1 mechanically coupled in series and parallel so that the total displacement is equal to the sum of the displacements of the devices connected in series. Such arrays are beneficial, in principle, but in practice are difficult to manufacture. In particular, it is difficult to properly align, physically couple and electrically connect all the devices in the array, especially as the number of devices in the array increases. For example the article by Ervin & Brei reports a practical embodiment in which various layers are bonded between devices with epoxy making manufacture a laborious process requiring high precision to properly align each device as the array is built up. Another problem is the leverage occurring between the ends 7 and 8. This means that the coupling between the devices must be insufficiently rigid to prevent the leverage rigidity from twisting the entire device 1 which would reduce the displacement in the desired direction.

It would be desirable to provide a device having a construction which allows large displacements to be achieved, whilst being relatively easy to manufacture.

According to the present invention, there is provided a piezoelectric device comprising a continuous piezoelectric element extending alternately back and forth to form a plurality of parallel, straight portions arranged in a stack with intermediate linkage portions at alternate ends of the straight portions, each straight portion being constructed and arranged with electrodes to bend, on activation, in the stacking direction in which the straight portions are stacked with opposite curvature in two halves of the straight portion to create displacement between the ends of the straight portion in the stacking direction.

In such a piezoelectric device, on activation, each straight portion bends with opposite curvature in its two halves, thereby creating relative displacement between the end of each straight portions. Therefore each straight portion operates in itself in a similar manner to the known device 1 described above. However, as a result of the piezoelectric device having a variety of parallel straight portions arranged in a stack, on activation the displacement adds in series through the stack. Thus a total displacement equal to the sum of the displacements of each straight portion is achieved. This means that the piezoelectric device may be arranged to generate large displacements. In general, any desired displacement may be achieved by selecting an appropriate number of straight portions. Furthermore, such a large displacement may be achieved whilst keeping the length of the individual straight portions to a low level, thereby avoiding the problem of the type described above.

Furthermore, in forming the piezoelectric device as a continuous piezoelectric element extending alternately back and forth, the piezoelectric device is simple to manufacture. For example, depending on the construction of the piezoelectric element, it might be formed by deforming a continuous piezoelectric element or by cutting a sheet of piezoelectric element to form overlapping slips extending from alternate sides of the sheet. In contrast to an array of separate piezoelectric devices mechanically coupled in series, there are no difficulties in properly aligning, physically coupling and electrically connecting the separate devices together.

Different types of construction for the piezoelectric element to cause the bending are envisaged.

In a first type of construction, the piezoelectric element has a bender construction, preferably a bimorph bender construction comprising two layers of piezoelectric material, but alternatively a unimorph or multimorph bender construction.

With such a bender construction, the piezoelectric device is simple to manufacture by bending spaced portions of a straight deformable continuous piezoelectric element around 180° to form the intermediate linkage portions, leaving the straight portions therebetween.

Alternatively, continuous and co-fired stacks of bimorph benders in accordance with the present invention can be manufactured using processes and methods known in general from the field of solid stacked multilayer piezo-ceramics, but modified in a novel way to achieve the stacked recurved or s-benders.

In a second type of construction, the continuous piezoelectric element is a sheet of piezoelectric material having overlapping slits extending from alternate sides to form the straight portions between the slits, with opposed electrodes arranged on each major surface of the sheet in pairs separated along, and extending along, the straight portions.

With such a construction, there are two pairs of opposed electrodes separated across the straight portions. On activation an electric field is generated between the opposed electrodes of each pair, the electric field being parallel to the direction in which the piezoelectric material is poled. As a result, the piezoelectric material between the opposed electrodes of each pair is activated in an expansion-contraction mode to undergo a change in length along the straight portions. In use, the straight portions are activated with a differential change in length of the material between each pair of opposed electrodes. As a result of the two regions being constrained because they are integral, the differential change in length is concomitant with bending sideways of the straight portion, that is about an axis parallel to the thickness of the sheet. This contrasts with the bending which occurs in a device having a known bender construction in which the bending occurs perpendicular to the thickness of the layers, that is about an axis across the layers.

The second type of construction has the advantage that it is stiffer, and hence generates a higher force, than a device having the first type of construction, that is a known bender construction, of comparable dimensions. This results from the fact that the bending occurs across the width of the straight portions rather than across the thickness of the sheet. Generation of higher forces is advantageous in many applications where the piezoelectric device is required to move significant masses.

In addition, the second type of construction provides several advantages in manufacture. Firstly, it is simple to manufacture a piezoelectric device in accordance with the present invention by cutting overlapping slits in a sheet of piezoelectric material.

In the second type of construction manufacture is simplified as compared to the first type of construction and have a reduced cost because the structure allows all the electrodes to be applied after firing after the piezoelectric material of the sheet because there are no buried electrodes.

With the known bimorph bender construction at least the centre electrode must be co-fired with the layers whilst sintering the piezoelectric element. Thus it is necessary to use a material for the centre electrode which can withstand the high temperatures during sintering, such as a noble metal. Such materials are expensive. In contrast, with the second type of construction as there are no buried electrodes, the electrodes may be applied after sintering of the sheet, for example by electroless deposition or by depositing a metallic ink. This simplifies manufacture and avoids the need to form the electrodes from an expensive material which can withstand sintering. This advantage results from the geometry of the device in which the pairs of electrodes are spaced across the width of the straight portion, rather than being spaced across the thickness of a multi-layer element.

To allow better understanding, embodiments of the present invention will now be described by non-limitative example with reference to the accompanying drawings, in which:

FIG. 1 is a cross-sectional view of a known piezoelectric device having a bimorph bender construction, the cross-section being taken along the length of the device;

FIG. 2 is a cross-sectional view of the piezoelectric device of FIG. 1 on activation.

FIG. 3 is a perspective view of a piezoelectric device comprising a piezoelectric element having a bimorph bender construction;

FIG. 4 is a perspective view of the piezoelectric device of FIG. 3 on activation;

Figure 5:
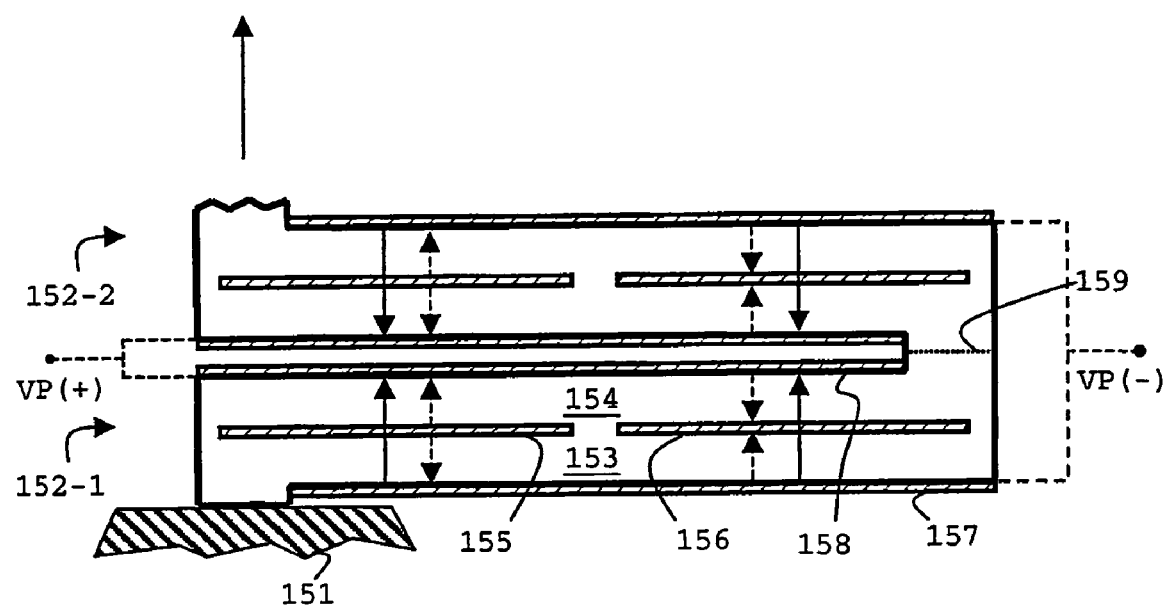
FIGS. 5 and 6 are a cross-section and an exploded view, respectively, of a section of a continuous stack of bimorph benders.

There will now be described piezoelectric devices having a continuous piezoelectric element with two types of construction for bending on activation. In both cases, the piezoelectric material is continuous along the element. The present invention could equally be implemented using other constructions which bend on activation.

The first type of construction is for the continuous piezoelectric element to have a bender construction, preferably a bimorph bender construction.

FIG. 3 shows a piezoelectric device 10 comprising a continuous piezoelectric element having a bimorph bender construction consisting of two parallel layers 11 of piezoelectric material. Perpendicular to the layers 11, the piezoelectric element 10 has a rectangular cross section which is uniform along the length of the element 10. The element 10 has pairs of outer electrodes 12 and a centre electrode 13 extending parallel to the layers 11. The thickness of the layers 11 in the direction perpendicular to the layers 11 is shown exaggerated for clarity. The layers 11 may be of any piezoelectric material, for example a piezoelectric ceramic such as lead zirconate titanate (PZT) or a polymer such as polyvinylideneflouride (PVDF).

The continuous piezoelectric element 11 is bent so that it extends alternately back and forth to form a plurality of parallel straight portions 14 arranged overlaid to form a stack in a stacking direction S. The continuous element 10 is illustrated in FIG. 3 as having three straight portions 14 merely for illustration. In general the element 10 may extend alternately back and forth further to form any number of straight portions 14. The portions 15 of the continuous piezoelectric element 10 between the straight portions 14 are curved around 180° to form linkage portions 15 at alternate ends of the straight portions 14 through the stack.

The centre electrode 13 extends along the entire length of the element 10, whereas the outer electrodes 12 are split along the length of the element 10. In particular, the outer electrodes 12 are split between the two halves 16 and 17 along the length of each straight portion 14 by a gap 18 so that the pairs of outer electrodes 12 are electrically isolated between the two halves 16 and 17. The two halves 16 and 17 are preferably of equal length. The gap 18 is shown in FIG. 3 with exaggerated length for clarity, but may in fact be of any size sufficient to isolate the two pairs of outer electrodes 12 extending along each straight portion 14. To prevent the gap 18 having a significant effect on the operation of the element 10, the gap 18 is preferably shorter than the length of the straight portions 14 by at least an order of magnitude. The outer electrodes 12 extend continuously around the linkage portions 15 between adjacent straight portions 14, although this is not essential.

In use, the outer electrodes 12 are electrically connected to a circuit (not shown) for supply or detection of voltages between the outer electrodes 12 on activation. As described in more detail below, the structural arrangement of the element 10 avoids the need to form an electrical connection to the centre electrode 13 on activation.

The layers 11 are poled in the same direction P in each half 16 and 17 of each straight portion 14. The poling direction P is in the same direction along the length of the element 10 relative to the layers 11, so that, as a result of the linkage portions 15 bending around 180°, the poling direction P is in alternate directions for successive straight portions 14 through the stack.

During use of the element 10, activation voltages are applied to the outer electrodes 12 to create an electric field E across the layers 11 effective to activate the layers 11. The direction of the applied electric field E during activation is always parallel to the poling direction so that the layers 11 either expand or contract depending on the relative activation of the electrical field E and of poling P. In each half 16 and 17 of each straight portion 14, the relative directions of the poling P and the applied electric field E are selected to cause one of the layers 11 to expand and the other of the layers 11 to contract. This causes each half 16 and 17 of each straight portion 14 to bend 14 about an axis extending across the straight portion parallel to the layers 11 due to the layers 11 being constrained by being joined together through the centre electrode 13.

For electrical activation, activation voltages are simultaneously applied to all the outer electrodes 12 with polarity as follows. The polarity of the activation voltages applied to the outer electrodes 12 of the halves 16 of each straight portion 14 on one side of the device are of a first polarity, whereas the activation voltages applied to all the outer electrodes 12 of the opposite half 17 of each straight portion 14 are of a second, opposite polarity. As a result, a voltage is induced on the centre electrode 13 which is intermediate between the voltages applied to the outer electrodes 12 in the two halves 16 and 17. Preferably the applied activation voltages are of the same magnitude, so that as a result of the symmetry of the device, the centre electrode floats at an induced voltage of 0V as though it were grounded. As a result, the applied electric field E is in opposite direction for the two layers 11 at all points along the length of the element 10. Furthermore, the applied electric field E across a single given layer 11 is in opposite directions for each half 16 and 17 of each straight portion 14. Thus, the straight portions 14 bend with curvature in an opposite sense in the two halves 16 and 17.

The device on activation is illustrated in FIG. 4. As the straight portions 14 bend in the stacking direction S with opposite curvatures in the two halves 16 and 17, this causes relative displacement between the ends of each straight portion 14 in the stacking direction. Furthermore, the relative displacements between the ends of each straight portion 14 add in series through the stack of straight portions 14 to relatively displace the ends of the element 10.

It is preferred but not essential for the electrodes 12 and 13 to extend continuously around the linkage portions 15 which may remain inactive. As a result of the electrodes 12 and 13 extending continuously around the linkage portions 15, activation of the linkage portions provides an additional contribution to the displacement between the ends of the element 10. In particular, on activation, the linkage portions 15 bend and open out causing a relative rotation of the straight portions 14 adjacent thereto causing the straight portions to act as cantilevers further displacing the ends of the element 10. In this case it is preferred that there are an even number of linkage portions 15 (i.e. an odd number of straight portions 14) so that the rotations caused by activation of the linkage portions 15 cancel out between the linkage portions in either half 16 and 17 of the element 10.

Other combinations of directions of poling P and of the electric field E may be used to produce the same bending on activation.

As an alternative to the bimorph bender construction of the element 10 illustrated in FIG. 3, the present invention may be implemented in an element having a unimorph bender construction consisting of a single layer of piezoelectric material and a layer of inactive material, or a multi-morph bender construction having more than two layers of piezoelectric material. Such bender constructions are known in themselves and operate in fundamentally the same manner as the bimorph bender construction described above.

The piezoelectric device may be electrically activated by applying activation voltages to the outer electrodes 12 to cause mechanical displacement between the ends of the element 10. In this case the device may be used as an actuator to relatively displace objects disposed against the ends of the element Conversely the piezoelectric device may be mechanically activated by relatively displacing the ends of the element 10 to generate activation voltages on the outer electrodes 12. In this case the piezoelectric device may be used as a sensor by detecting the activation voltages.

Manufacture of piezoelectric devices comprising an element with the first type of construction will now be described.

The method fundamentally comprises providing a straight deformable continuous piezoelectric element 10 having the desired bender construction, and being spaced portions of that element around 180° to form the intermediate linkage portions 15, leaving the straight portions 14 therebetween. To allow such bending, there must exist in the initially provided element 10 a sufficient degree of flexibility to allow the deformation. The piezoelectric material of the layers 11 is preferably a piezoelectric ceramic, such as PZT, in the green state containing polymers providing flexibility to the material. After shaping, the element is sintered to set the piezoelectric material. Manufacturing techniques using such ceramic piezoelectric in the green state and the subsequent sintering are in themselves known and may be readily applied to the present invention.

The manufacture will now be described in more detail.

Firstly, the straight deformable piezoelectric element 10 is made using conventional techniques. The preferred technique is for the layers 11 of piezoelectric material and the centre electrode 13 to be co-extruded. With this technique the centre electrode 13 must be relatively thick since in its green state it should have a similar rheology to the material of the layers 11 in the green state. Possible materials are for the layers to be of PZT and for the centre electrode 13 to be made of silver-loaded PZT, in which case the layers 11 are also loaded with a small amount of silver to prevent diffusion.

As an alternative, the continuous piezoelectric element 10 may be formed by laminating the layers 11 of piezoelectric material. In this case, the centre electrode 13 may be printed from a metallic ink, for example an ink loaded with platinum of silver palladium. Preferably, a gap is maintained between the edges of the centre electrode 13 and the circumferential external interface between the layers 11 to prevent accidental electrical connection to the centre electrode 13 which remains floating in use. The deformable element 10 may be initially formed with dimensions to be bent into a single piezoelectric device.

As another alternative, the continuous piezoelectric element may be formed using a novel laminating or stacking process. Stacking as such is well known and is mainly used to assemble multilayered stacks of piezoelectric disks.

A known stacking process is for example described in the published U.S. patent application No. 01/0009344, incorporated herein for reference to the known steps in a manufacturing process for piezoelectric stacks.

In order to manufacture a stack of benders the process is modified in certain important aspects that are described below.

The bender stack is based on single bender units that are manufactured by stacking single layer of green piezoelectric tape. A first two units of a stack in accordance with this variant of the invention are shown in FIG. 5, where a first bimorph bender unit 152-1 with a two layers of piezoelectric material (PZT) 153, 154 is mounted on base 151. Two center electrodes 155, 156 are embedded between the two layers. Two outer face electrodes 157, 158 cover the upper and lower face, respectively, of the bender unit. A second unit 152-2 is mounted in reversed orientation onto an edge 159 of the first unit. A plurality of bender units can be thus mounted to form a stack. Arrows illustrate the required poling and actuation field directions. Poling directions are indicated using solid-line arrows. The electric field applied to generate actuation is indicated using dashed-line arrows. During poling the center electrodes 155, 156 are left floating.

As described below, all four side faces of the unit cell have lead-out points to be used at various stages of the manufacturing process and during activation of the stack.

Figure 6:
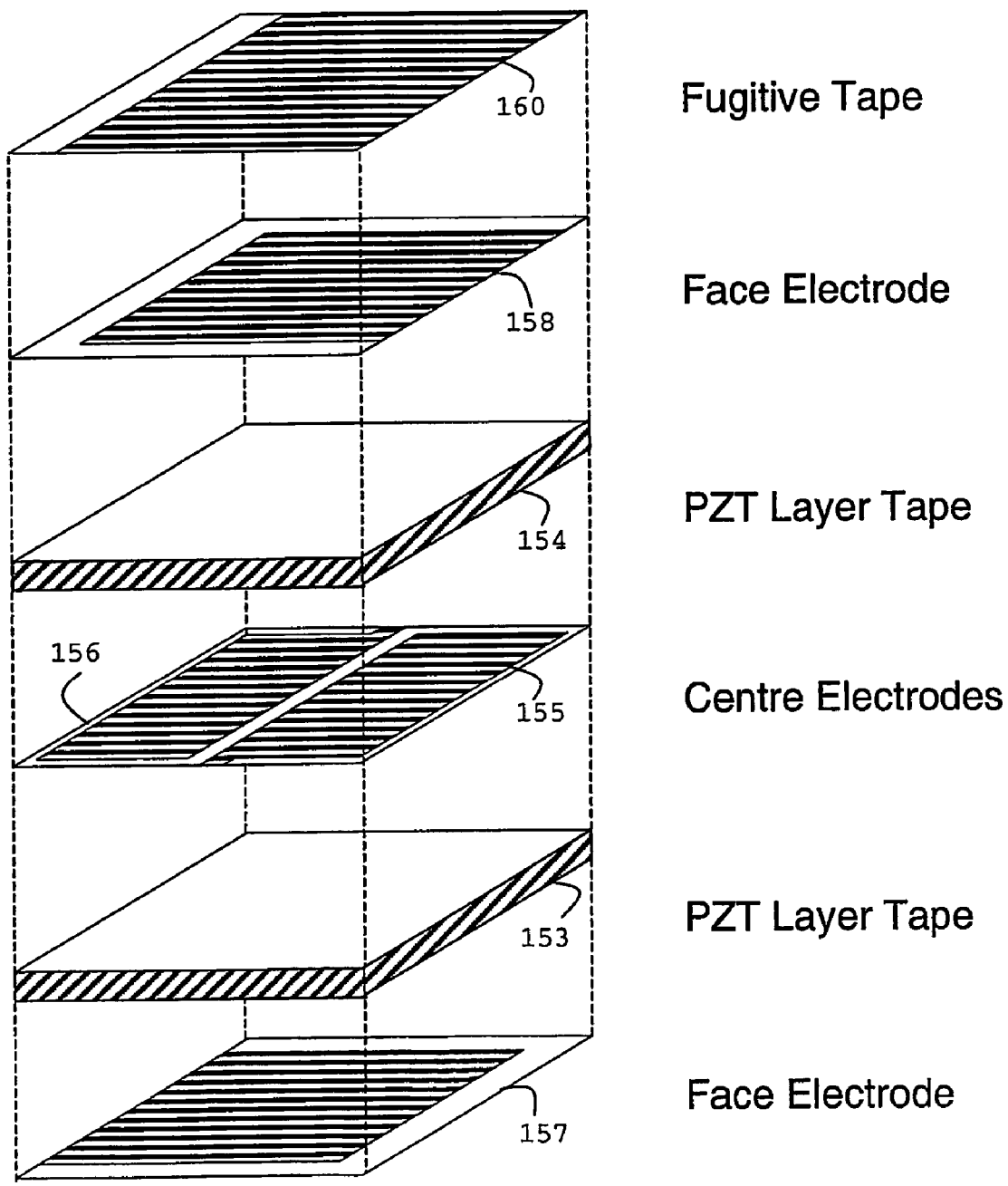

One possible arrangement is to connect the outer face electrodes 157, 158 to the left and right faces as shown in FIG. 6, while the center electrodes are patterned such that one half connects via the front face and the other connects via the rear. As the stack is assembled by stacking bender units in alternating orientation, all electrodes that in use share one potential can be contacted via the same side face of the stack.

Figure 7:
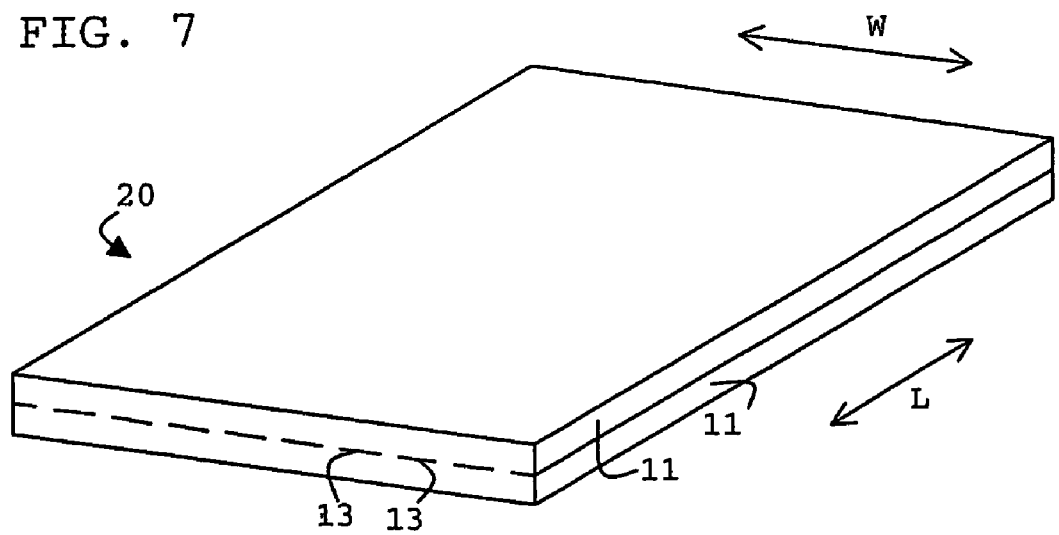
FIG. 7 is a perspective view of a deformable element in the form of a sheet used to manufacture a plurality of piezoelectric devices.

An exploded view of a bender unit 152 is shown in FIG. 7, illustrating the sequence of layers and prints required for its manufacture. Numerals are equal to those used in FIG. 6. The lower outer face electrode 157 is screen printed onto the lower PZT layer 153. The center electrodes 155, 156 are printed onto either the top face of the first layer 153 or the lower face of the second PZT layer 154 or partly onto both PZT layers. The top outer face electrode 158 is printed onto the top face of the second layer 154.

An important consideration when fabricating such structures is how to fuse or laminate the bimorph bender units 152 at the edge 159 while maintaining a gap between the remaining parts of the units.

In the present invention, a fugitive or removable layer 160 is placed between the bender units. This layer can be deposited on top of the outer electrode layers during the green tape lay-up process preserving the electrode prints. This tape material can then be either physically removed after drying of the structure, or burnt out during the binder removal phase. It was found that polythene sheeting could be removed after drying of the laminate, provided that external tabs are left behind. Alternatively, the fugitive layer 160 may be made of a material, such as carbon, that burns out during the sintering stage.

Several prints can be produced in parallel on a single layer of green tape. By stacking such layers in the appropriate sequence, green tapes comprising series of bender units can be manufactured in one firing process. After introducing a layer of fugitive or removable tape, a second green tape layer of bender units is stacked onto the first green tape. By repeating these steps, a stack of green tapes is produced forming multiple stacks of bender units, each separated by fugitive tape except at edge section at which the units are designed to form a continuous or quasi-continuous bond. After pressing the stack of green tapes, drying and removing any removable or fugitive tape sections, the stack is burned out and fired. Thus, a complete stack of recurved or S-benders is manufactured through a co-firing process whereas it was previously through post-firing bonding that such stacks were manufactured. Also the neighboring units provide additional support to prevent the gap between vertically aligned units from collapsing during the firing process.

By designing the pattern for the outer face electrodes such that all outer electrodes 156, 157 have a common conductive path or rail, the whole stack of layers of units can be poled after sintering, but before the assembly is cut into the individual units. To pole the piezoelectric layers in accordance with the directions indicated by the solid arrows in FIG. 6, the appropriate poling voltage VP(+) and VP(−) is applied to the outer face electrodes 156, 157 while the center electrode are left without defined potential, i.e., floating.

After poling, the stack of layers of bender units is cut to form the individual stacks shown in FIG. 6. After cutting, the terminal or face electrodes can be connected via pad printed electrodes running along the appropriate faces, connecting to lead-outs of the center electrodes 155, 156. The outer face electrodes are left floating during activation, hence, require no joint connection along the side face of the stack.

Though several other methods to pole and activate a recurved or S-shape bimorph bender are known, the specific configuration as described above provides at least two significant advantages when applied to a continuous stack: The poling process making only use of the outer face electrodes 157, 158 allows to pole batches of stacks prior to cutting. And having only two terminal electrodes per bender unit during activation facilitates the deposition of the terminal electrodes along the faces of the stack.

By co-firing the laminated bender units in their green state, the ceramic sections fuse to form a continuous or essentially continuous stack of piezoelectric benders.

Alternatively to the above methods of forming a continuous stack of benders, the straight element may be initially provided in the form of a sheet which is cut by planar cuts perpendicular to the axes around which the linkage portions are bent to form a plurality of piezoelectric devices in accordance with the present invention. FIG. 7 shows an example of such a sheet 20 comprising two layers 11 of piezoelectric material. The sheet 20 has the same constructions along its length L as the piezoelectric element 10 of a single device as illustrated in FIG. 3. After bending, the sheet 20 is cut by making planar cuts perpendicular to the sheet 20 along its length L to cut the sheet 20 into separate elements 10. The sheet 20 has a plurality of centre electrodes 13 spaced across the width W of the sheet 20 and extending along the length L, the planar cuts being made between the electrodes 13.

The following techniques for producing the piezoelectric device from a straight piezoelectric element may be applied equally to a deformable element 10 that forms an individual device or to a sheet 20 such as that illustrated in FIG. 7 that is to be cut into plural devices.

The deformable element 10 is initially provided without outer electrodes 12. However, the deformable element is preferably provided with outer sacrificial layers extending parallel to the piezoelectric layers 11 and made of a material that is removable, for example a material that will be burnt out during sintering such as carbon. Such a sacrificial layer sets the gap between the straight portions 14 after bending, thereby reducing the required tolerances of the bending process. The sacrificial layer may be, for example, a carbon-filled tape which is laminated to the element 10.

The deformable element is then bent, in particular by bending spaced portions of the element around 180° to form the intermediate linkage portions 15, leaving the straight portions 14 therebetween. There are many ways to perform the bending.

Figure 8:
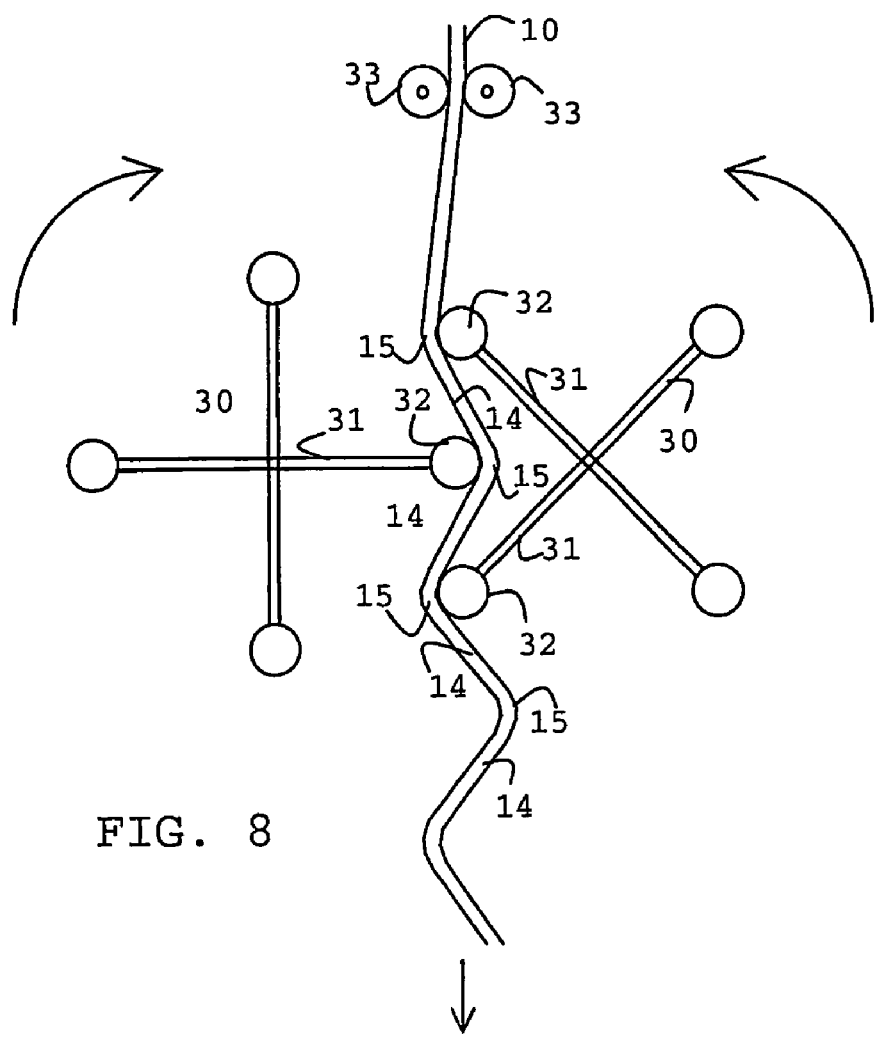
FIG. 8 is a side view of a first apparatus for bending the deformable element.

FIG. 8 shows an apparatus for performing the bending by pressing the element successively from alternate sides. The apparatus comprises a pair of rotatable presses 30 having four (or indeed any number of) radially extending meshed arms 31 with cylinders 32 mounted on the ends of the arms 31. The presses 30 are rotated in synchronism whilst the deformable element 10 is driven by drive rollers 33 between the meshed arms 31. As a result, the cylinders 32 press the member 10 successively from alternate sides thereby bending spaced portions 15 and leaving the straight portions 14 therebetween. The apparatus of FIG. 8 bends the spaced portion around an angle of less than 180° to corrugate the tape 10 without leaving the straight portion 14 parallel to one another. To bend the linkage portions 15 around a full 180°, in a subsequent stage the ends of the element 10 are pressed together to leave the straight portions parallel to one another.

Figure 9:
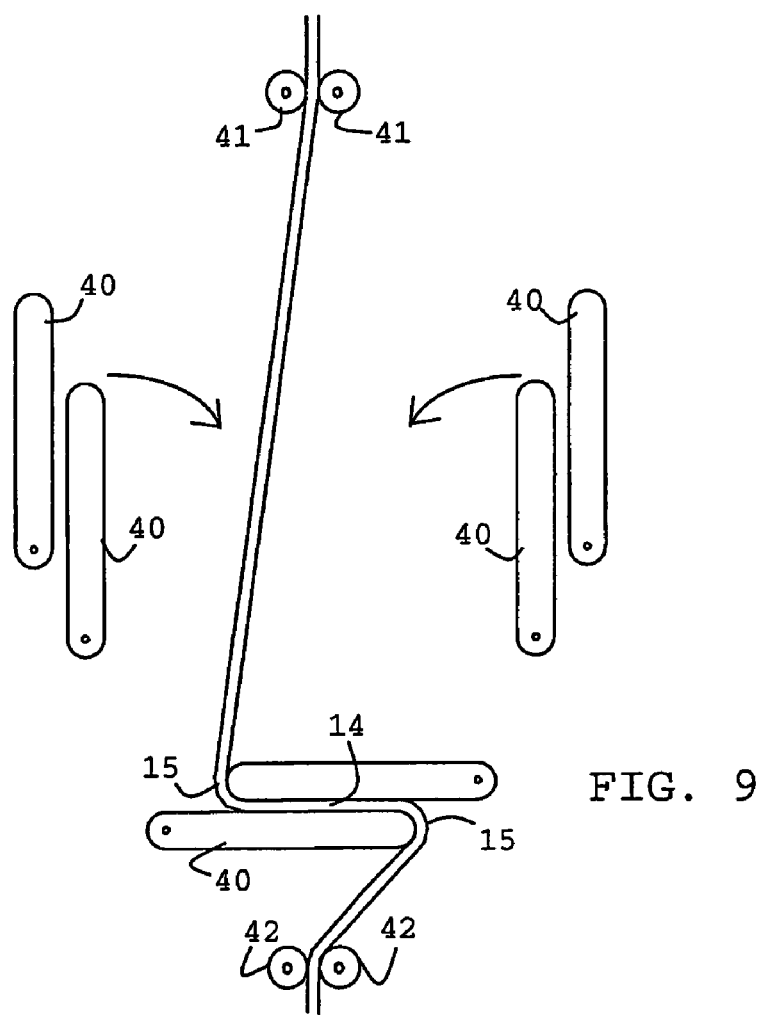
FIG. 9 is a side view of a second apparatus for bending the deformable element.

FIG. 9 illustrates a second apparatus for bending the continuous element 10 using a plurality of flaps 40 arranged in two sets, one set on either side of the element 10 when driven into position by drive rollers 41 and 42. Once the deformable element 10 is in position, the flaps 40 are rotated against the element 10, using flaps 40 alternately from the two sets of flaps 40 on opposite sides of the element 10. The flaps 40 rotate to a final position where the flaps 40 are parallel to one another, thereby pressing the element 10 successively from alternate sides and bending the linkage portions 15 around the end of the flaps, leaving the straight portions 14 in gaps between the flaps 40. When all of the flaps 40 have been rotated, the flaps are withdrawn linearly out of the gaps between the straight portions 14 leaving the shaped element 10.

Other techniques for bending the element 10 are equally envisaged, for example by pressing the element 10 between two rigid presses with interlocking protrusions between which the element 10 is bent into shape.

When bending the element 10, the radius of curvature of the intermediate linkage portions 15 will typically be equivalent to the thickness of the element 10. This produces a relatively large gap between the straight portions 14 of the element 10 because it is in the green state. This is not a great problem, because the curved intermediate linkage portions 15 themselves contribute to the relative displacement of the ends of the element 10. Optionally, to reduce the radius of curvature, the intermediate linkage portions 15 are pressed to reduce their thickness before bending of the element 10.

The next stage is to sinter the piezoelectric material to set it, using conventional sintering techniques. For example, a typical process would be to sinter the element 10 firstly at temperatures of up to 600° C. and subsequently to densify the material of the layers 11 by further sintering at temperatures typically between 1000° C. and 1200° C.

Subsequently, the outer electrodes 12 are applied. As the electrodes 12 are applied after sintering, it is not necessary to use materials for the outer electrodes 13 which can withstand sintering, but instead cheaper materials can be used.

The next stage is to pole the piezoelectric material of the layers 11. The element 10 is poled in the same direction relative to the layers 11 along the length of the element 10 (i.e. as though the element 10 were stretched straight), so that the poling is in opposite directions for successive straight portions 14 as a result of the linkage portions 15 curving around 180°. The poling may be achieved by inserting poling electrodes from alternate sides in the gaps between the straight portions 14. A poling voltage sufficient to pole the material of the piezoelectric material of the layers 11 is applied across the electrodes inserted from the opposite sides. This is preferably performed with the element 11 and poling electrodes immersed in a fluid having a high dielectric constant, at least greater than that of air, to reduce the field drop across the inevitable gaps between the poling electrodes and the piezoelectric material. This technique for poling the layers is particularly suitable for larger devises where the gap between the straight portions 14 is relatively large.

The outer electrodes 13 may be formed by separately dipping each half 16 and 17 of the element 10. A suitable dipping process is to dip a first one of the halves 16 and 17 in a photoresist, then to plate the entire element 10 and then to remove the photoresist, this process then being repeated on the second one of the halves 16 and 17. Such a dipping process is particularly suitable for piezoelectric devices having a relatively large gap between the straight portions 14. The accuracy of the dipping process that is necessary to ensure a sufficient gap 18 between the outer electrodes 12 in the two halves 16 and 17 is limited by the capillary action of the fluid in the gaps between the straight portion which worsens as the gaps get thinner.

An alternative method for applying the electrodes is an evaporation deposition process. An example of such a process performed on an element in the form of a sheet which is subsequently cut to form separate elements 10 will now be described.

Figure 10:
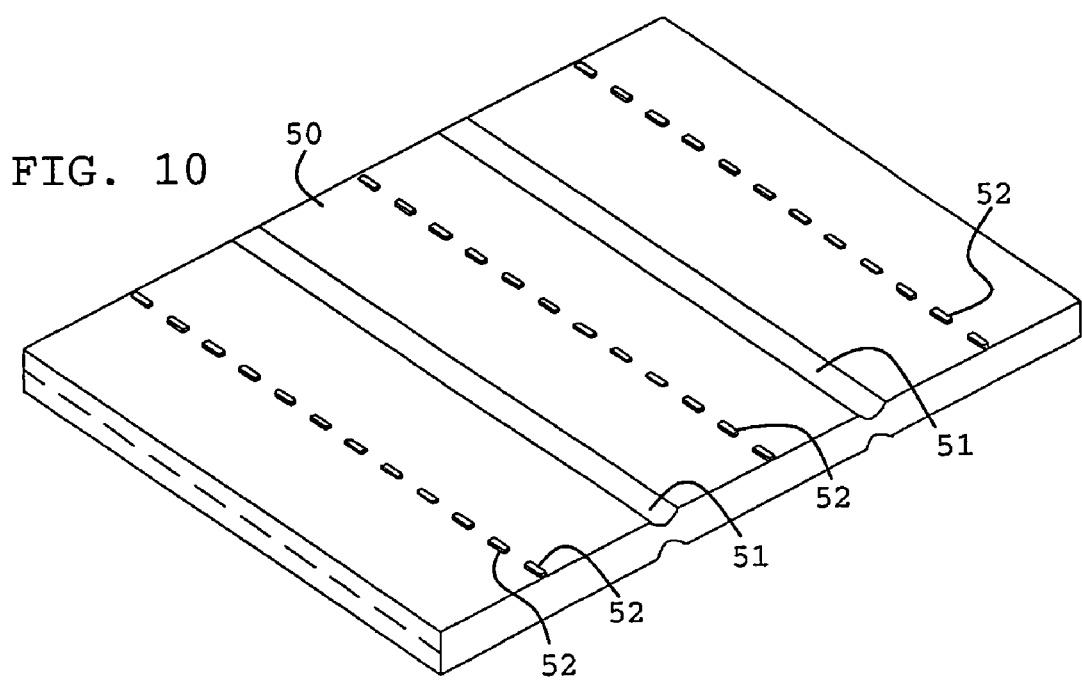
FIGS. 10 and 11 are perspective views of further deformable elements in the form of a sheet.
Figure 11:
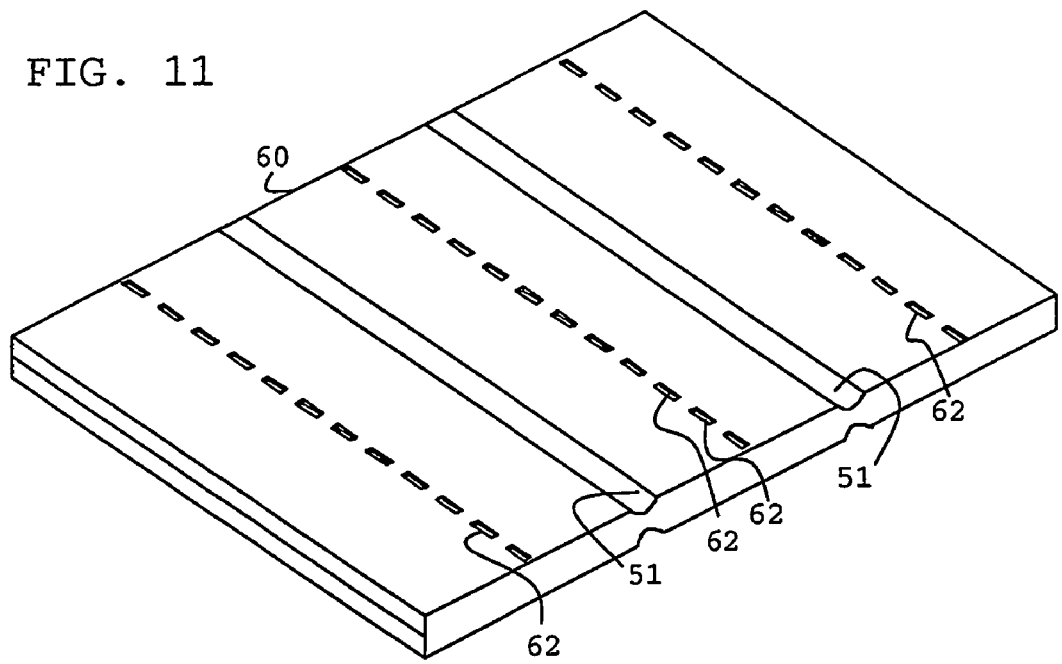

A sheet 50 or 60 as illustrated in FIGS. 10 and 11, respectively, is used. The sheets 50 and 60 have the same construction as the sheet 20 of FIG. 7, except as follows.

Both the sheets 50 and 60 are formed with grooves 51 extending across the width of the sheets 50 and 60 at positions where the intermediate linkage portions 15 are to be formed. The grooves 51 may be made by passing the sheets 50 and 60 through rollers with embossing shapes to form the grooves 51.

The sheet 50 is additionally formed with respective sets of ridges 52, the ridges 52 of each sets being spaced across the width W of the sheet 50 and each ridge extending across a portion of the width of the sheet 50 which is to form a single element after cutting of the sheet 50. The ridges may be formed by screen printing a later if piezoelectric material on to the sheet 50. Optionally, a second screen printing operation may be used to apply a sacrificial layer in the gap between the ridges 52 of a material which is removable, as described above. The screen printing may need to be repeated several times to obtain the appropriate thickness of the sacrificial layer. The ridges 52 are wider than the centre electrodes 13 so that when the sheet 50 is cut into separate elements, the ridge 51 runs across the entire width of each straight portion 14.

The sheet 60 of FIG. 11 has grooves 62 in exactly the same pattern as the ridges 52 of the sheet 50 of FIG. 10.

Subsequently the sheet 50 or 60 is bent using the techniques described above, the grooves 51 acting as registration points to provide the linkage portions 15 in the correct locations with the ridges 52 or grooves 62 exactly half way along the straight portion 14 to divide the straight portion 14 into the two halves 16 and 17.

After bending, the sheet 50 or 60 is sintered. If a sacrificial layer is used, as described above, the sheet can be pressed to ensure the dimensions in the green state are tightly controlled.

Figure 12:
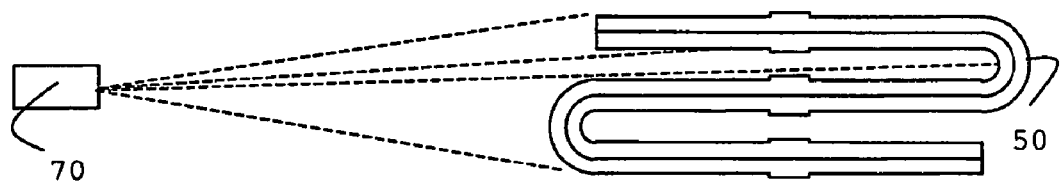
FIG. 12 and 13 are side views of an evaporation deposition process performed on the sheets of FIGS. 10 and 11 after bending.
Figure 13:
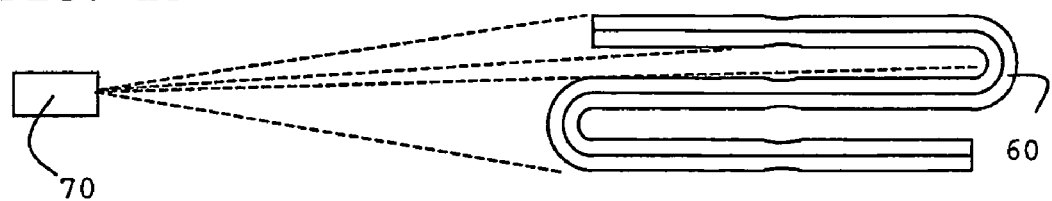

After sintering, the outer electrodes 13 are applied using a vaporisation deposition process, for example as illustrated in FIGS. 12 and 13. In particular, the sheet 50 or 60 is arranged in a high vacuum together with a source material 70. Any suitable material may be used, for example copper or aluminum. The source material 70 is heated to evaporate it to cause deposition onto the sheet 50 or 60. The ridges 52 of the sheet 50 or the grooves 62 of the sheet 60 from a shadow where no electrode material is deposited.

The deposition process may be repeated with the source 70 arranged at different angles to the sheet 50 or 60 to deposit the material of the electrodes 13 on all required faces.

The advantage of using ridges 52 as in the sheet 50 is that they can be made using the same standard screen printing equipment as may be used for laminating the sheet 50.

The advantage of using grooves 62 as in the sheet 60 is that they can be formed during the same embossing process as is used for forming the grooves 51. Furthermore, during the evaporation process the width of the split in the outer electrodes 13 between the two halves 16 and 17 may be accurately set without requiring a fine tolerance on the angle to the source 70, and also without requiring high tolerance on the depth of the depression. On the other hand, with the ridges 52 the shadow and hence the width of the gap 18 between the halves 16 and 17 is highly dependent on the height of the ridges 52 and the angle of the source 70 to the sheet 50.

The deposition process deposits electrode material in the gaps between the ridges 52 or grooves 62, thereby providing an electrical connection on the sheet 50 or 60 between the outer electrodes 12 in the two halves 16 and 17 of each straight portion 14. Subsequently, the sheets 50 or 60 is poled which may be performed by making a single connection to the outer electrodes 12 on each major surface of the sheet 50 or 60 which are electrically connected along the entire length of the sheet 50 or 60 through the electrode material deposited between the ridges 52 or grooves 62. Hence it is not necessary to insert the poling electrode in the gaps between the straight portions 14 as described above.

After poling, the sheet 50 or 60 it is cut by planar cuts along the length of the sheet to form separate piezoelectric elements 10 as illustrated in FIG. 3. In so cutting the sheet 50 or 60, the portions across the width of the sheet 50 or 60 between the ridges 52 or grooves 62 are removed so that there is no electrical connection between the outer electrode 13 in the two halves 16 and 17 of the straight portions 14.

The methods described above involve applying the outer electrodes after sintering. As an alternative, the outer electrodes may be screen printed on to the deformable element 10 before sintering, in the same manner as the centre electrode. This is a less desirable option, firstly because it is necessary to use material for the outer electrodes 12 which can withstand sintering, such materials being expensive, and secondly because the increased thickness of the deformable element increases the radius of curvature of the intermediate portions 15, thereby increasing the gaps between the straight portions 14.

Preferably, the outer electrodes 12 in each half 16 and 17 of the element 10 are connected together on both sides of the element 10, so that the outer electrodes 12 of each half 16 and 17 may be connected to a circuit by a single connection. One way to achieve this is to use an evaporation deposition process as described above, but with the source directed on the side of the device to form an electrical connection across both layers 11. A barrier is arranged across the gaps 18 between the halves 16 and 17 of each straight portion to prevent deposition of an electrical connection between the outer electrodes 12 of each half 16 and 17. The process is preferably repeated with the source angled relative to the device so that a reliable connection can be made around the angled corner between the side and face surfaces of the layers 11. A copper wire or conductive tape can then be daisy-chained down the sides of the device to connect the corresponding halves 16 and 17 of the straight portion 14 together. The wire or tape may be joined using a soldering or conductive epoxy process. The wire or tape is looped slightly between the straight portions 14 to allow proper displacement without the electrical connections being strained.

There will now be described a piezoelectric device in which the piezoelectric element has the second type of construction.

Figure 14:
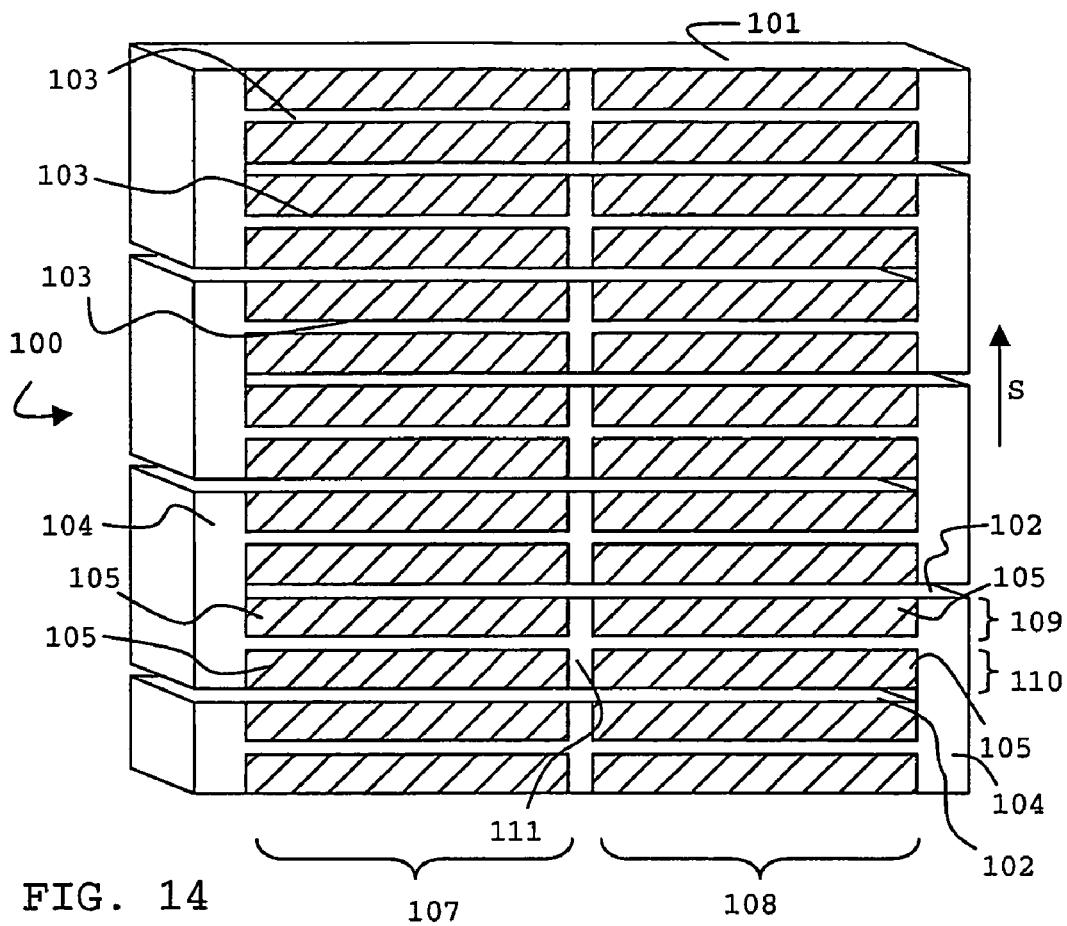
FIG. 14 is a perspective view of a piezoelectric device comprising piezoelectric element having a second type of construction.

FIG. 14 illustrates such a piezoelectric device 100 comprising a piezoelectric element 101 in the form of a sheet. The element 101 has overlapping slits extending alternately from opposite sides. Thus the piezoelectric element 101 extends alternately back and forth around the slits 102 with a plurality of straight portions 103 formed between the overlapping portions of the slits 102. Linkage portions 104 are formed by the portions of the element 101 beyond the end of the slits 102 intermediate the straight portions 103.

The element 101 may be made of any suitable piezoelectric material, for example a piezoelectric ceramic such a lead zirconate titanate (PZT) or a piezoelectric polymer such as polyvinylideneflouride (PVDF).

The material of the piezoelectric element is poled across the thickness of the sheet 101 between the major surfaces. In addition, electrodes 105 are provided along each of the straight portions 103 as follows. The electrodes 105 are provided with an identical pattern on each of the opposed major surfaces of the element 101, only one of which is visible in FIG. 14. Along the length of each straight portion, the electrodes 105 are arranged in two pairs spaced across the width of the straight portion 103 with a gap 106 between each pair so that the pairs of electrodes 105 are electrically isolated from each other. The electrodes 105 extend along the length of the straight portion 103, but are split between the two halves 107 and 108 of each straight portion by a gap 111 so that the electrodes 105 are electrically isolated between two halves 107 and 108. The two halves 107 and 108 are preferably of equal length. The gap 111 is shown in FIG. 14 with exaggerated length for clarity, but may in fact be of any size sufficient to isolate the electrodes 105. To prevent the gap 111 having a significant effect on the operation of the element 101, the gap 111 is preferably shorter than the length of the straight portions by at least an order of magnitude.

In use, the electrodes 105 are electrically connected to a circuit (not shown). The circuit may apply activation voltages to electrically activate the straight portions 103 or may detect the activation voltages generated by mechanical activation of the element 101.

On activation, an electric field is developed between the opposed electrodes 105 of each pair, that is in the two regions 109 and 110 spaced across the width of each straight portion 103. That is to say, the electric field is developed across the thickness of the straight portions 103. The direction of the electric field E is parallel to the direction of poling, so the material of each straight portion in the regions 109 and 110 is activated in an expansion-contraction mode. In fact, the activation voltages of opposite polarity are applied between each pair of opposed electrodes 105 so that the electric field is in opposite directions in the two regions 109 and 110 across the width of the straight portions 103. Thus there is a differential change in length of the straight portions 103 between the two regions 109 and 110 across the width of the straight portions, and so, as a result of the regions 109 and 110 being constrained by being integral with each other, the differential change in length is concomitant with bending of the straight portion 103 parallel to its width.

This is similar to the bending of elements having a known bender construction where bending is also driven by a differential change in length. However, bending of the element 101 occurs across the width of the straight portions 103 around an axis parallel to the thickness direction in which the electrical field is developer This is because the pairs of electrodes 105 in the regions 109 and 110 are spaced across the width of the straight portions 103. In contrast, in the known bender construction, the layers which undergo a differential change in length are spaced across the thickness of the layers, so that bending occurs about an axis extending across the layers perpendicular to the electric field, as illustrated above with reference to FIGS. 2 and 4.

Furthermore, the activation voltages are applied to cause bending with opposite curvature in the two halves 107 and 108 of each straight portion 103. As the poling is in the same direction across the entire piezoelectric 101, this is achieved by the applied activation voltages being of opposite polarity in the two halves 107 and 108 of each straight portion 103.

Other combinations of directions of poling P and of the electrical field E are equally possible.

Figure 15:
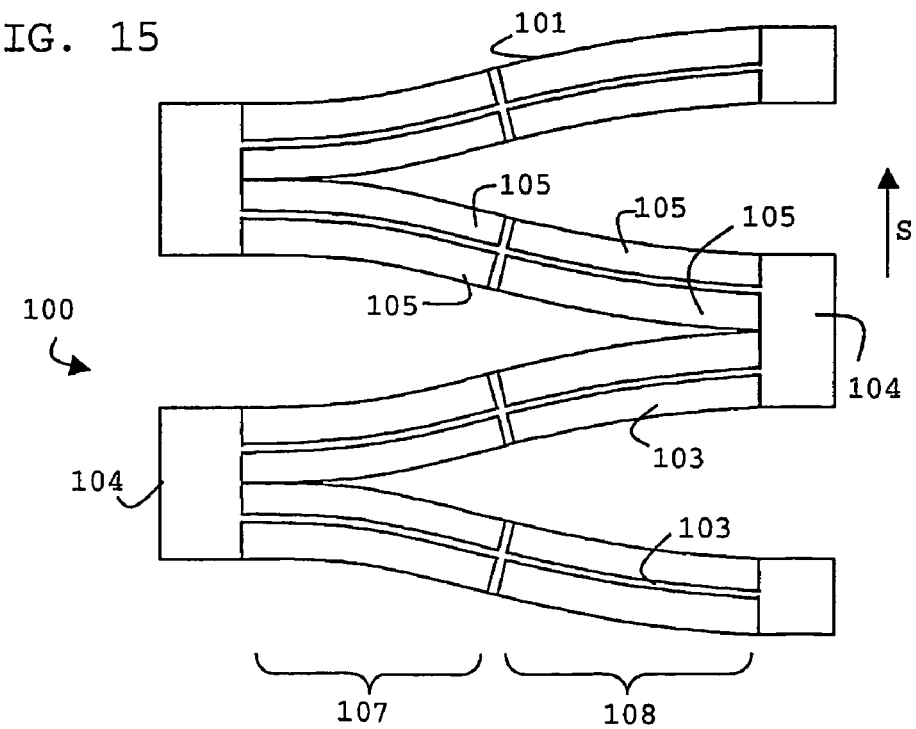
FIG. 15 is a side view of a piezoelectric device comprising a piezoelectric element having a second type of construction.

FIG. 15 illustrates a device having the same construction as that of FIG. 14, although with a different number of straight portions 103 on activation. As the stacking direction S with opposite curvatures in the two halves 107 and 108, this causes relative displacement between the ends of each straight portion 103 in a stacking direction. This relative displacement is shown exaggerated for clarity in FIG. 15. Furthermore, the relative displacement between the ends of each straight portion 103 adding series through the stack of straight portions 103 so that the relative displacement between the ends of each straight portion 103 sum together.

As to the relative dimensions of the second type of construction, it is preferable that the length L, the width W and the thickness T of each straight portion 103 are arranged such that L>>W>T. The thickness T is necessarily small to allow development of a high electric field across the element 101 for a given activation voltage. The width W is selected to be greater than the thickness T, preferably considerably greater. For instance a typical thickness T might be less 1 mm in which case the width W might be several mm.

Since bending occurs across the width, the straight portions 103 are stiff in the direction of bending. This means that the force generated is increased, albeit associated with the reduction in the displacement. Therefore, a particular advantage of the second type of construction is to provide higher forces, albeit with a lower displacement, as compared to devices with the first type of construction having an element of comparable dimensions.

Figure 16:
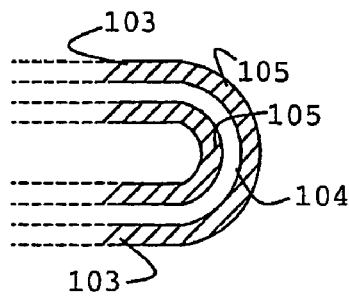
FIG. 16 is a partial side view of an intermediate linkage portion with an alternative electrode configuration.

In the embodiments described above, the intermediate linkage portions 104 are formed without electrodes, so that they remain inactive. However, as an alternative, the two pairs of electrodes on adjacent straight portions 103 may extend continuously between the straight portions 103 around the intermediate linkage portions 104, for example as illustrated in FIG. 16 which is a partial view of the piezoelectric element 101 showing the intermediate linkage portion 104. In this case, the shape of the intermediate linkage portions 104 is curved.

As a result, on activation, the linkage portions 104 also bend in the same manner as the straight portions 103. This causes the intermediate portions 104 to open and close causing a relative rotation of the straight portions 103 adjacent thereto. This, in turn provides an additional contribution to the displacement between the ends of the element 101 by changing the orientation of the straight portions as a cantilever.

A plurality of piezoelectric devices 100 may be arranged to operate in parallel by stacking the elements 101 with the major surfaces of each sheet facing one another.

The method of manufacture of the piezoelectric device 100 is straightforward. Basically, it may be formed by initially providing the element 101 as a complete sheet which is cut to form the slits 102, then the electrodes may be applied using conventional techniques.

Such a process is cheap and simple, because sheets of piezoelectric material are readily commercially available. The method may be applied to any type of piezoelectric. The preferred material is a piezoelectric ceramic such a PZT. In this case, the element 101 may be cut before or after sintering, but preferably the cutting is performed after sintering so that the slits 102 do not cause deformation of the element 101 during the shrinkage which inevitably occurs during sintering.

The electrodes 105 may be applied by any suitable technique, such as electroless deposition of a metallic ink. In principle the electrodes may be applied before or after sintering, but preferably are applied after sintering, so that it is not necessary to make the electrodes from a material which is capable of withstanding temperatures sufficient to sinter the piezoelectric material. The electrodes may be made of any suitable metal.

A preferred method to apply the electrodes is to feed the element 101 through two pairs of inked rollers inked in an appropriate pattern, thereby applying the electrodes 105 simultaneously on both major surfaces of the element 101. Alternatively, an electro pre-cursor may be deposited on the elongate member prior to sintering, for instance an activator for electroless deposition. In this case, after sintering the electrode may be produced by immersing the element 101 in a suitable electroless plating solution.

After application of the electrodes 103, the material of the element 101 is poled by applying poling voltage sufficient to pole the material of the element 101 in the regions 109 and 110 between each pair of opposed electrodes 105.

The invention claimed is:

1. A piezoelectric device comprising a continuous piezoelectric element extending alternately back and forth to form a plurality of parallel, straight portions arranged in a stack with intermediate linkage portions at alternate ends of the straight portions, each straight portion being constructed and arranged with electrodes to bend, on activation, in the stacking direction in which the straight portions are stacked and to bend with curvature in an opposite sense in two halves of the straight portion to cause relative displacement between the ends of the straight portion in the stacking direction adding in series through the stack.

2. A piezoelectric device according to claim 1, wherein the continuous piezoelectric element has a bender construction comprising a plurality of layers, at least one of which is of piezoelectric material poled across the at least one layer, arranged with electrodes extending along the straight portions parallel to the layers for applying an activation voltage across the at least one layer of piezoelectric material.

3. A piezoelectric device according to claim 2, wherein the bender construction of the continuous piezoelectric element comprises two layers of piezoelectric material.

4. A piezoelectric device according to claim 2, wherein the intermediate linkage portions of the continuous piezoelectric element are bent around 180°.

5. A piezoelectric device according to claim 4, wherein the electrodes extend continuously between adjacent straight portions around the intermediate linkage portions.

6. A piezoelectric device according to claim 5, having an odd number of straight portions.

7. A piezoelectric device according to claim 4, wherein the intermediate linkage portions are thinner than the straight portions.

8. A piezoelectric device according to claim 2, wherein the electrodes in the two halves of each straight portion are split and the at least one layer of piezoelectric material is poled in the same direction in each half of each straight portion.

9. A piezoelectric device according to claim 1, wherein the continuous piezoelectric element comprises a stack of bender elements fused at the intermediate linkage portion by co-firing.

10. A piezoelectric device according to claim 1, wherein the continuous piezoelectric element is a sheet of piezoelectric material poled across the sheet having overlapping slits extending from alternate sides of the sheet to form the straight portions between the slits, with opposed electrodes arranged on each major surface of the sheet in pairs extending along, and separated across, the straight portions.

11. A piezoelectric device according to claim 10, wherein the electrodes in the two halves of each straight portion are separated and the sheet of piezoelectric material is poled in the same direction in each half of each straight portion.

12. A piezoelectric device according to claim 11, wherein the pairs of electrodes extend continuously between adjacent straight portions around the intermediate linkage portions, opposed on each major surface of the sheet.

13. A piezoelectric device according to claim 12, having an odd number of straight portions.

14. A piezoelectric device according to claim 13, wherein each straight portion has at least two centrally embedded and independently contactable electrodes thereby defining the two halves of the straight portion.

15. A piezoelectric device according to claim 14, wherein the central electrodes have lead-outs to different side faces of the device.

16. A piezoelectric device according to claim 14, wherein each straight portion has a single direction of poling.

17. A piezoelectric device according to claim 14, wherein each straight portion has face electrodes adapted to be kept at floating electrical potential during operation.

* * * * *